US006552436B2

(12) United States Patent
Burnette et al.

(10) Patent No.: US 6,552,436 B2

(45) Date of Patent: Apr. 22, 2003

(54) SEMICONDUCTOR DEVICE HAVING A BALL GRID ARRAY AND METHOD THEREFOR

(75) Inventors: Terry E. Burnette, New Braunfels, TX (US); Thomas H. Koschmieder, Austin, TX (US); Andrew J. Mawer, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/733,170

(22) Filed: Dec. 8, 2000

(65) Prior Publication Data

US 2002/0070451 A1 Jun. 13, 2002

(51) Int. Cl.[7] .......................... H01L 31/00; H01L 23/12

(52) U.S. Cl. ....................... 257/777; 257/778; 257/779; 257/739; 257/738; 257/786; 257/459; 257/625; 438/666; 438/613; 438/612; 438/108

(58) Field of Search ................................ 257/777, 778, 257/779, 739, 459, 625, 786, 738, 737; 438/613, 666, 612, 108

(56) References Cited

U.S. PATENT DOCUMENTS 5,668,405 A * 9/1997 Yamashita .................. 257/668
5,859,475 A * 1/1999 Freyman et al. ............ 257/738
5,872,399 A * 2/1999 Lee ............................ 257/738
5,990,545 A * 11/1999 Schueller et al. ........... 257/697
6,201,305 B1 * 3/2001 Darvaeux et al. ........... 257/779
6,210,992 B1 * 4/2001 Tandy et al. ................ 438/106

* cited by examiner

*Primary Examiner*—Eddie Lee
*Assistant Examiner*—Joseph Nguyen
(74) *Attorney, Agent, or Firm*—Daniel D. Hill

(57) ABSTRACT

A semiconductor device (50) includes a semiconductor die (52) having electronic circuitry that is connected to a substrate (54). The substrate (54) is used to interface the semiconductor die (52) to a printed circuit board (64). The substrate (54) includes a plurality of bonding pads (56, 58). A first portion of the plurality of bonding pads are soldermask defined (SMD) bonding pads (56) and a second portion of the plurality of bonding pads are non-soldermask defined (NSMD) bonding pads (58). Using a combination of SMD and NSMD bonding pads provides the advantages of good thermal cycling reliability and good bending reliability over devices that have only SMD bonding pads or NSMD bonding pads.

16 Claims, 3 Drawing Sheets

SEMICONDUCTOR DEVICE HAVING A BALL GRID ARRAY AND METHOD THEREFOR

FIELD OF THE INVENTION

This invention relates generally to semiconductor devices, and more particularly, to a semiconductor device having a ball grid array and method therefor.

BACKGROUND OF THE INVENTION

In some semiconductor manufacturing processes, such as for example, "flip chip", bumps are fabricated on pad areas of a semiconductor die in order to interconnect the die to a package or to a substrate. The substrate is used to interface the electrical circuits of the semiconductor die to a printed circuit board. In some instances, the semiconductor die may be attached directly to the printed circuit board.

An integrated circuit manufactured using "flip chip" technology may have hundreds of these solder bumps. In solder ball, or solder bump, technology, various techniques may be used to define the area on the pads for receiving the solder balls. One technique provides a solder ball connection area called a soldermask defined (SMD) bonding pad. Another technique provides a solder ball connection area known as a non-soldermask defined (NSMD) bonding pad.

FIG. 1 illustrates a soldermask defined bonding pad in accordance with the prior art. A SMD bonding pad is provided on both a substrate 12 and on a printed circuit board 22. The SMD bonding pad on substrate 12 includes a metal bonding pad 14 formed on substrate 12. Substrate 12 is generally used to interconnect, or interface a semiconductor die (not shown) with printed circuit board 22. A soldermask coating 16 is formed over substrate 12 and covers a portion of bonding pad 14. A portion of the metal bonding pad 14 is left exposed. A solder ball 24 is then attached to bonding pad 14. When connecting substrate 12 to printed circuit board 22, a bonding pad 20 is formed on the surface of printed circuit board 22. A solder mask 18 is formed over the surface of printed circuit board 22 and overlaps a portion of bonding pad 20 to form another SMD bonding pad. The openings in the soldermask coatings 16 and 18 define the area of the bonding pads to which the solder attaches for making electrical contact between the substrate 12 and printed circuit board 22. Also, the soldermask prevents liquid solder from flowing over areas where it is not wanted, such as for example, along a metal trace. In addition, the soldermask functions to shape the solder ball 24 after it is reflowed.

FIG. 2 illustrates a non-soldermask defined bonding pad in accordance with the prior art. An NSMD bonding pad is illustrated on both a substrate 32 and a printed circuit board 42. The NSMD bonding pad on substrate 32 includes a metal bonding pad 34. As described above in connection with FIG. 1, substrate 32 is used to interconnect, or interface a semiconductor die (not shown) with printed circuit board 42. A soldermask coating 36 is formed over substrate 32 and has an opening that does not typically contact or overlap bonding pad 34. A solder ball 44 is attached to bonding pad 34. Likewise, a bonding pad 40 is formed on the surface of printed circuit board 42 where it is intended to connect to bonding pad 34. A solder mask 38 is formed over the surface of printed circuit board 42 and has openings that do not typically cover or overlap any of bonding pad 40. The shape and size of the bonding pads function to determine the shape of the solder ball after solder reflow.

SMD bonding pads are known to provide greater reliability in applications where the printed circuit board is subjected to high bending loads, such as for example, a cellular telephone that includes push buttons on the same printed circuit board as the integrated circuits. However, SMD bonding pads are not known for providing high reliability in those applications that subject the printed circuit board to thermal cycling, such as for example, in an automotive application. In contrast, NSMD bonding pads are known to provide high reliability in extreme temperature applications, but not high reliability when subjected to bending loads.

Therefore, a need exists for a technique to attach a semiconductor device to a printed circuit board that provides improved bending reliability as well as improved reliability when exposed to temperature cycling.

BRIEF DESCRIPTION OF THE DRAWINGS

The present invention is illustrated by way of example and not limited in the accompanying figures, in which like references indicate similar elements, and in which.

DESCRIPTION OF A PREFERRED EMBODIMENT

Generally, the present invention provides a semiconductor device and a method for attaching the semiconductor device to a printed circuit board. The semiconductor device includes a semiconductor die having electronic circuitry that is connected to a substrate. The substrate is used to interface the semiconductor die to a printed circuit board. The substrate includes a plurality of bonding pads arranged as a grid array, for example, Land, Ball, and Column. A first portion of the plurality of bonding pads are characterized as soldermask defined (SMD) bonding pads and a second portion of the plurality of bonding pads are characterized as non-soldermask defined (NSMD) bonding pads. It has been determined that the advantages of good thermal cycling reliability and good bending reliability can be achieved for the same printed circuit board by including both SMD and NSMD bonding pads on the same semiconductor device.

Figure 1:
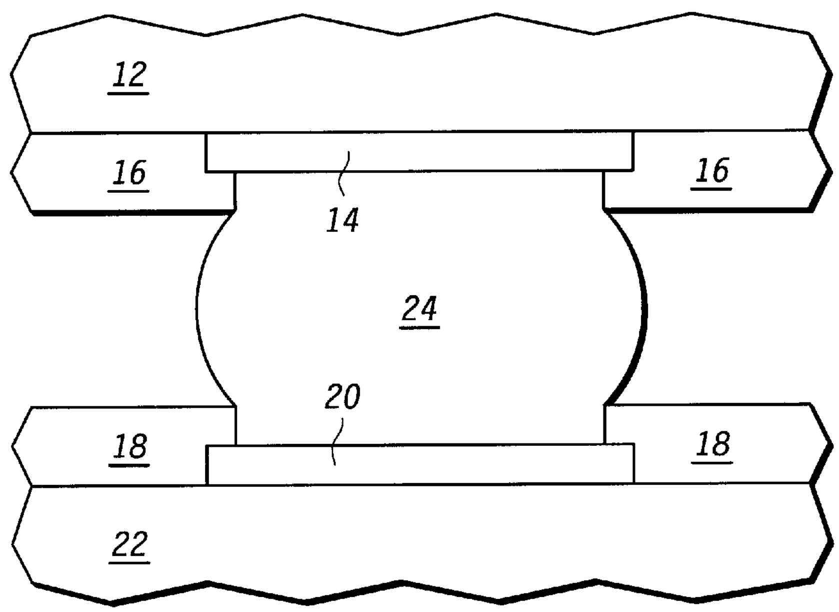
FIG. 1 illustrates a soldermask defined bonding pad in accordance with the prior art.
Figure 2:
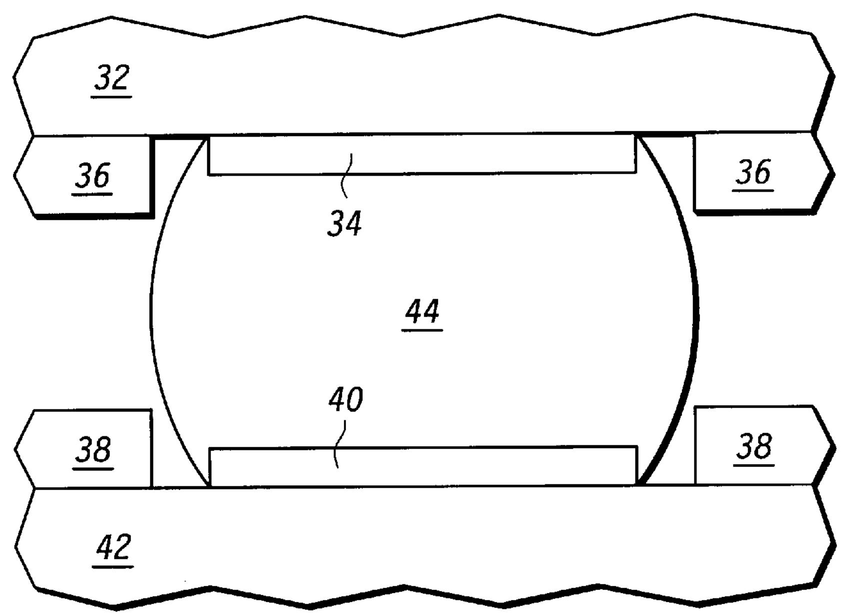
FIG. 2 illustrates a non-soldermask defined bonding pad in accordance with the prior art.
Figure 3:
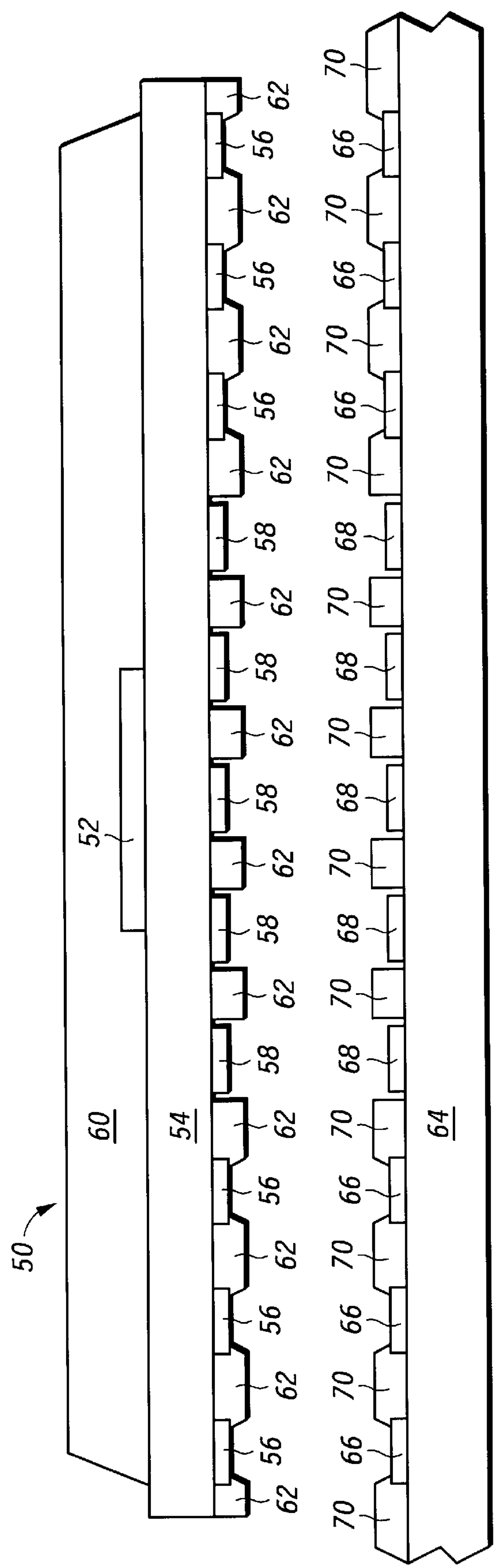
FIG. 3 illustrates a cross-sectional view of a semiconductor device and printed circuit board in accordance with an embodiment of the present invention.

FIG. 3 illustrates a cross-sectional view of a semiconductor device 50 and printed circuit board 64 in accordance with an embodiment of the present invention. Semiconductor device 50 includes a semiconductor die 52 that is attached to a substrate 54. In the illustrated embodiment, semiconductor die 52 is an integrated circuit fabricated from a silicon wafer. Substrate 54 is a commonly used substrate for interfacing the semiconductor die 52 with a printed circuit board and is typically formed from an organic material. Semiconductor die 52 is attached to substrate 54 using one of the commonly known techniques, such as for example, the C4 (Controlled Collapse Chip Connection) bump process, the E3 (Extended Eutectic Evaporative) bump process, the conductive adhesive process, or the wire bond process. The method used to connect semiconductor die 52 to substrate 54 is not important for purposes of describing the present invention and will not be described further. After semiconductor die 52 is attached to the substrate 54, the surface of the substrate and the die are encapsulated using a common mold compound encapsulation material.

SMD bonding pads 56 and NSMD bonding pads 58 are formed on the other side of substrate 54. The bonding pads are typically laid out as an array, or matrix, for electrically connecting the substrate to the printed circuit board. An SMD bonding pad 56 includes a metal bonding pad, typically made from copper. An insulative coating 62, also known as a soldermask, is deposited on substrate 54 so that an opening is formed over bonding pad 56. The opening is smaller than the bonding pad and overlaps a portion of bonding pad 56. The overlapping portion of soldermask 62 is for defining a connection area for a solder interconnect and shapes the solder connection between the substrate and the printed circuit board.

NSMD bonding pads 58 include metal bonding pads 58. The bonding pads are not covered with soldermask 62 and have an exposed edge. In the NSMD bonding pad technique, the exposed edge of the bonding pad defines a connection area for a solder interconnect.

In the illustrated embodiment, printed circuit board 64 has a combination of SMD and NSMD bonding pads in locations that correspond to the bonding pads of semiconductor device 50. As described above, SMD bonding pads 66 are formed by overlapping a portion of the metal bonding pads with soldermask 70 so that the edge of the soldermask openings define the solder ball shape. Also, NSMD bonding pads 68 are formed by making the soldermask openings large enough that the metal bonding pads are not covered.

Solder balls (not shown in FIG. 3) are formed on bonding pads 56 and 58. To connect semiconductor device 50 to printed circuit board 64, the solder balls are remelted, or reflow attached, after placing the solder balls of semiconductor device 50 in contact with the bonding pads of printed circuit board 64.

Through experimentation, it has been determined that the best bending reliability and the best thermal cycling reliability is achieved by using a combination of both SMD and NSMD bonding pad types to connect a substrate to a printed circuit board as illustrated in FIG. 3. In the illustrated embodiment, SMD bonding pads are used around the outer edge of the substrate because these are the pad locations that have been found to be more likely to break when subjected to bending stress. Likewise, NSMD bonding pads are used for the interior locations of the substrate, as illustrated in FIG. 3, because these are the pad locations more likely to fail under thermal cycling. Note that in the illustrated embodiment, the outer three rows of bonding pads are SMD, but in other embodiments, a different number of outer rows may be SMD. Also, the actual locations for the SMD and NSMD bonding pads may be different depending on a number of variables such as die size, number of bonding pads, solder ball volume, substrate thickness, encapsulation thickness, etc. Also, in other embodiments, a different combination of SMD and NSMD bonding pads may be used to provide improved thermal cycling and bending reliability. As an example, a combination of SMD and NSMD bonding pads may be used on the substrate, while the printed circuit board has one only one of either SMD or NSMD bonding pads. In addition, in another embodiment, the SMD and NSMD combination may be used on the printed circuit board but not on the substrate and still be within the scope of the invention.

Figure 4:
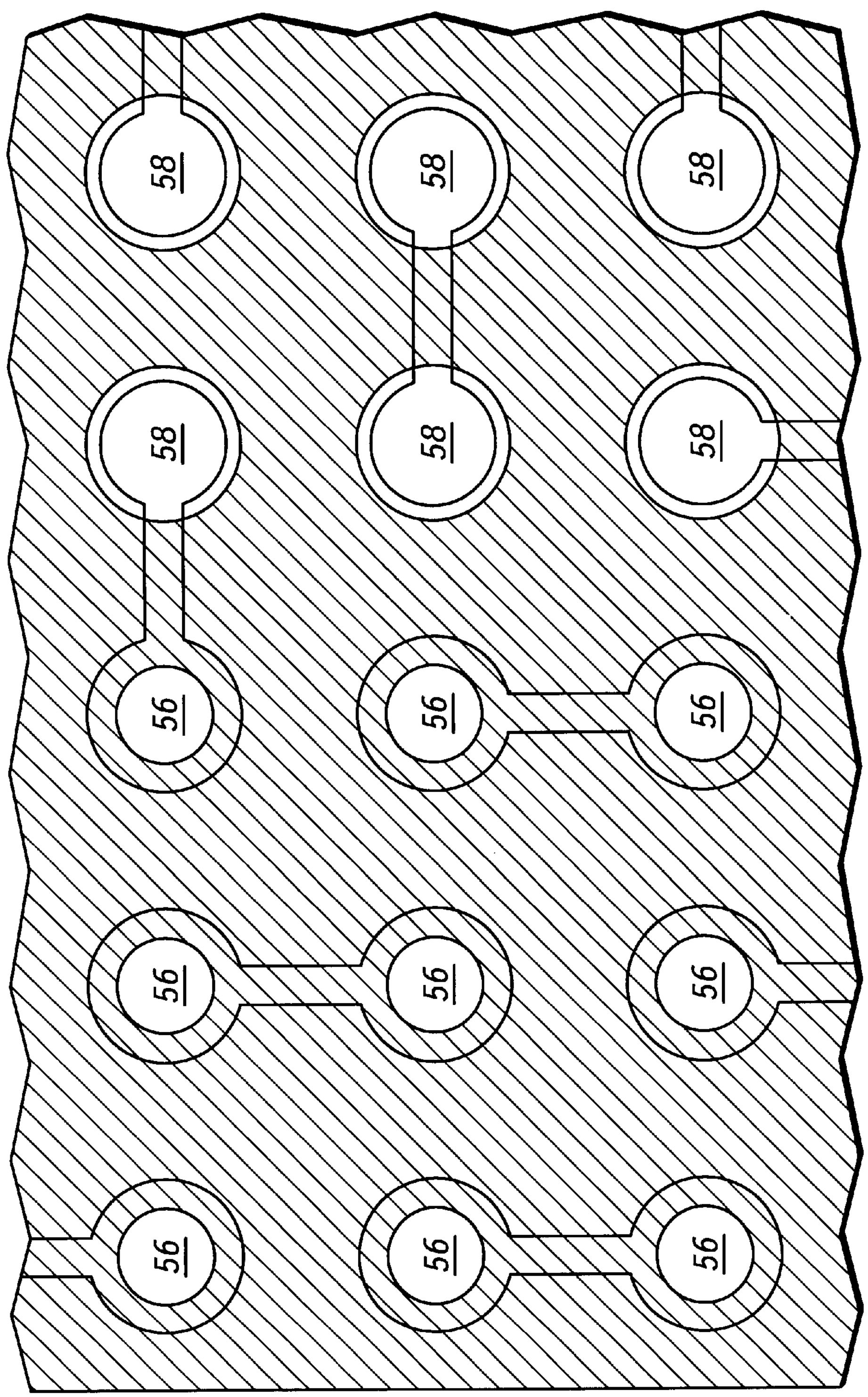
FIG. 4 illustrates a bottom-up view of a portion of the semiconductor device of FIG. 3.

FIG. 4 illustrates a bottom-up view of a portion 80 of semiconductor device 50 of FIG. 3. The cross-hatching over portion 80 is soldermask 62. The left side of portion 80 is an edge of substrate 54. As can be seen in FIG. 4, SMD bonding pads 56 are formed by making openings in soldermask 62 that are smaller than the metal bonding pads. As discussed above, the shape of the solder ball after melting and connecting to the printed circuit board is largely determined by soldermask 62. The NSMD bonding pads 58 are formed by making openings in soldermask 62 that are larger than the bonding pad. The shape of the solder connection is determined by the edge of the metal pad and not by the soldermask. Note that in the illustrated embodiment, the metal pads of NSMD bonding pads 58 are slightly larger than the metal pads of SMD bonding pads 56. Also, note that for illustration purposes, traces are provided between adjacent bonding pads. In other embodiments, the routing of traces and the presence of vias (not shown) is determined by the particular application.

While the invention has been described in the context of a preferred embodiment, it will be apparent to those skilled in the art that the present invention may be modified in numerous ways and may assume many embodiments other than that specifically set out and described above. For example, in the illustrated embodiment, the bonding pads have a circular shape. In other embodiments, the bonding pads may have a square, rectangular, or other shape. Accordingly, it is intended by the appended claims to cover all modifications of the invention which fall within the true scope of the invention.

What is claimed is:

1. A semiconductor device, comprising:

a semiconductor die having electronic circuitry; and a substrate for interfacing the semiconductor die to a printed circuit board, the substrate having a plurality of bonding pads for connecting to the printed circuit board, a first portion of the plurality of bonding pads being characterized as soldermask defined bonding pads and a second portion of the plurality of bonding pads being characterized as non-soldermask defined bonding pads.

2. The semiconductor device of claim 1, wherein a soldermask defined bonding pad on a surface of the substrate comprises a metal bonding pad and having an insulative coating on the substrate overlapping a portion of the metal bonding pad, the overlapping portion for defining a connection area for a solder interconnect.

3. The semiconductor device of claim 1, wherein a non-soldermask defined bonding pad on a surface of the substrate comprises a metal bonding pad and having an exposed edge, the exposed edge defining a connection area for a solder interconnect.

4. The semiconductor device of claim 1, wherein the first portion of the plurality of bonding pads are the outermost bonding pads in an array of bonding pads.

5. The semiconductor device of claim 4, wherein the outermost bonding pads are the three outer rows of bonding pads on the substrate.

6. The semiconductor device of claim 4, wherein the second portion of the plurality of bonding pads are the innermost bonding pads in the array of bonding pads.

7. The semiconductor device of claim 1, further comprising a printed circuit board for receiving the semiconductor die, the printed circuit board having a plurality of bonding pads for connecting to the substrate, a first portion of the plurality of bonding pads being characterized as the soldermask defined bonding pads and a second portion of the plurality of bonding pads being characterized as the non-soldermask defined bonding pads.

8. The semiconductor device of claim 1, further comprising a printed circuit board for receiving the semiconductor die, the printed circuit board having a plurality of bonding pads for connecting to the substrate, the plurality of bonding pads being characterized as soldermask defined bonding pads.

9. The semiconductor device of claim 1, further comprising a printed circuit board for receiving the semiconductor die, the printed circuit board having a plurality of bonding pads for connecting to the substrate, the plurality of bonding pads being characterized as non-soldermask defined bonding pads.

10. A printed circuit board, comprising a plurality of bonding pads for connecting to a semiconductor device, a first portion of the plurality of bonding pads being characterized as soldermask defined bonding pads and a second portion of the plurality of bonding pads being characterized as non-soldermask defined bonding pads.

11. The printed circuit board of claim 10, wherein the printed circuit board is a substrate for interfacing a semiconductor die to the printed circuit board.

12. The printed circuit board of claim 10, wherein the first portion of the plurality of bonding pads are the outermost bonding pads in an array of bonding pads.

13. The printed circuit board of claim 10, wherein the outermost bonding pads are the three outer rows of bonding pads of the printed circuit board.

14. The printed circuit board of claim 10, wherein a substrate is provided for interfacing the printed circuit board to a semiconductor die, a first portion of a plurality of bonding pads on the substrate being characterized as the soldermask defined bonding pads and a second portion of the plurality of bonding pads being characterized as the non-soldermask defined bonding pads.

15. The printed circuit board of claim 10, wherein a substrate is provided for interfacing the printed circuit board to a semiconductor die, the substrate having a plurality of bonding pads for connecting to the printed circuit board, the plurality of bonding pads being characterized as soldermask defined bonding pads.

16. The printed circuit board of claim 10, wherein a substrate is provided for interfacing the printed circuit board to a semiconductor die, the substrate having a plurality of bonding pads for connecting to the printed circuit board, the plurality of bonding pads being characterized as non-soldermask defined bonding pads.

* * * * *